US005796583A

United States Patent [19]
Gale et al.

[11] Patent Number: 5,796,583
[45] Date of Patent: Aug. 18, 1998

[54] CIRCUIT PACK AND ENVIRONMENTAL PROTECTION ASSEMBLY

[75] Inventors: Geoffrey N. Gale, Neapean; Richard J. Glover; Steve J. Lischynsky, both of Ottawa, all of Canada

[73] Assignee: Northern Telecom Limited, Montreal, Canada

[21] Appl. No.: 827,884

[22] Filed: Apr. 7, 1997

[51] Int. Cl.[6] ............................................ H05K 7/20
[52] U.S. Cl. ........................ 361/704; 361/707; 361/709; 361/710; 361/718; 361/728; 361/796; 361/800; 174/16.3
[58] Field of Search ............................ 361/704, 707, 361/709, 710, 718, 720, 721, 800, 796, 818; 174/16.3

[56] References Cited

U.S. PATENT DOCUMENTS

| | | | |
|---|---|---|---|
| 4,771,365 | 9/1988 | Cichocky et al. | 165/80.3 |
| 5,109,318 | 4/1992 | Funari et al. | 361/710 |
| 5,396,401 | 3/1995 | Nemoz | 361/704 |
| 5,506,373 | 4/1996 | Hoffman | 361/719 |

Primary Examiner—Leo P. Picard
Assistant Examiner—Boris L. Cheruinsky
Attorney, Agent, or Firm—R. J. Austin

[57] ABSTRACT

An assembly of a circuit pack and an environmental protection in which the protection is a heat conductive and fluid-tight cover surrounding the pack and sealed to an electrical cover at one end of the pack. The cover is heat conductively connected with the circuit pack and has guide surfaces to enable the assembly to be guided in an electronic shelf. The cover is also provided with handling regions to enable its removal from the shelf and is resistant to buckling. There may be a resilient clip provided at each side edge of the cover. The clip holds the cover in heat conductive engagement with the circuit pack and has an outer surface which acts as a guide surface.

6 Claims, 3 Drawing Sheets

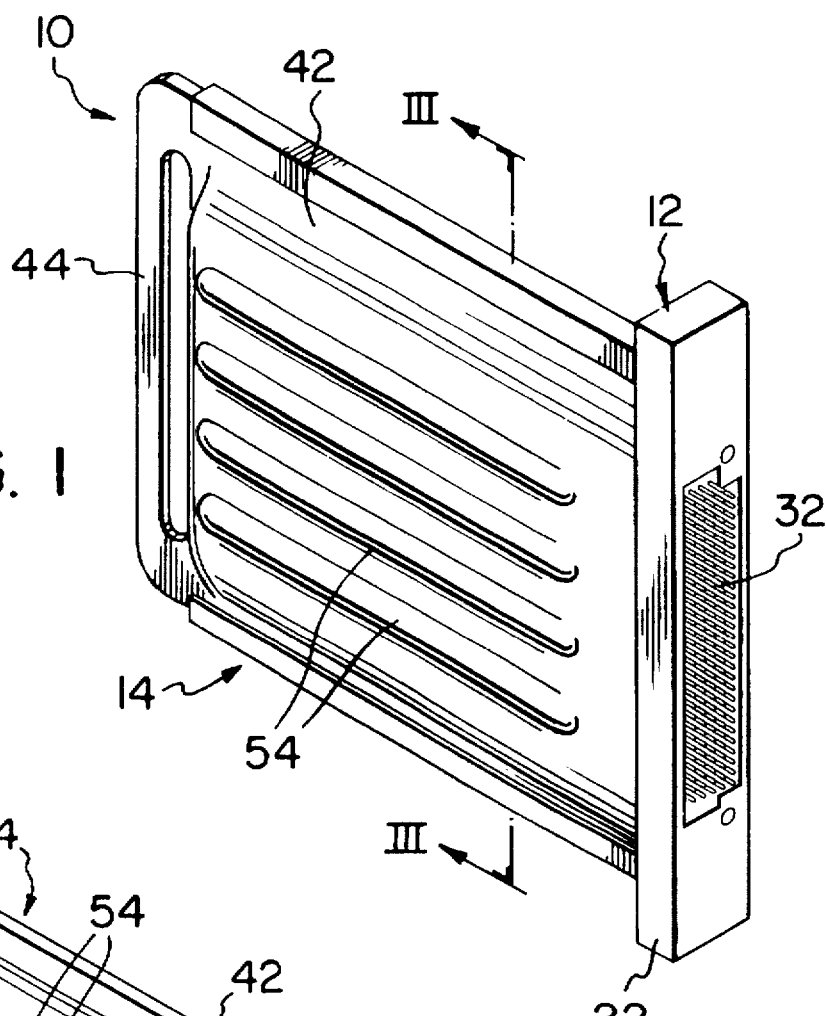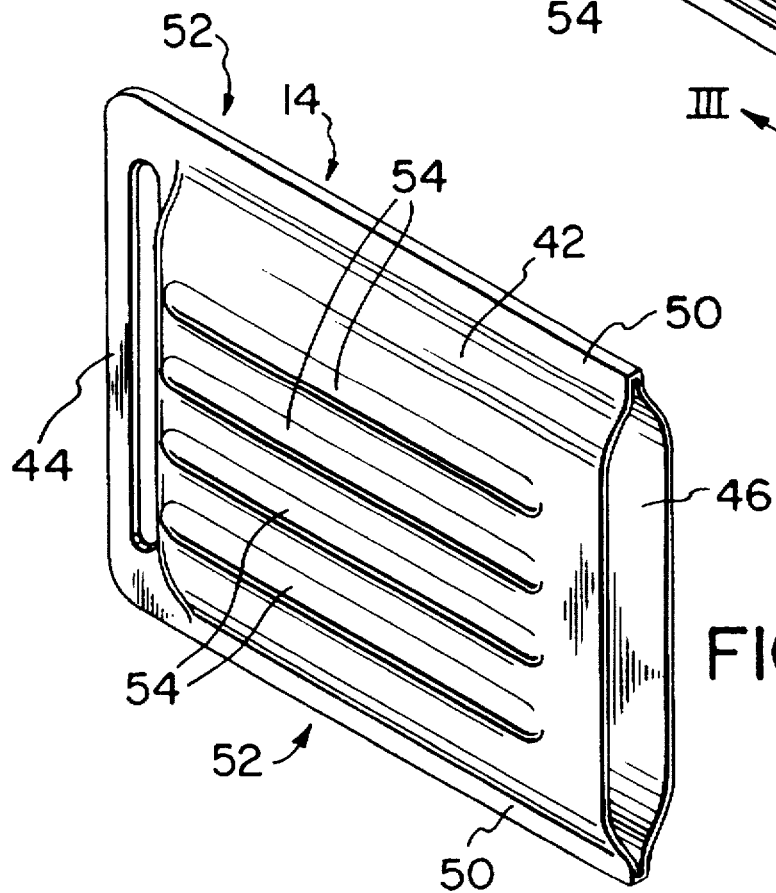

5,796,583

CIRCUIT PACK AND ENVIRONMENTAL PROTECTION ASSEMBLY

FIELD OF THE INVENTION

This invention relates to circuit pack and environmental protection assemblies.

BACKGROUND OF THE INVENTION

Circuit packs for insertion into electronic shelves have outwardly exposed conductors and electronic components. To increase operational life of such circuit packs, environmental protection is provided. This protection is normally in the form of an air control which operates only to control operational temperature and the dew point. However, the electronic components and conductors are subject to corrosion from the action of corrosive materials in the atmosphere e.g. acids which are emitted as a result of industrial activity. Undoubtedly, where electronic equipment is housed in shelves which are in the vicinity of such industrial plant as blast furnaces or chemical plants, it is accepted that the circuit packs will not normally be expected to be operational for such lengthy periods as are possible with circuit packs disposed in other and less atmospherically corrosive conditions. It is known therefore that the presence of corrosive materials in the atmosphere does have an effect upon the operational life of circuit packs. Yet while a great deal of attention has been paid to the control of the operational temperature and dew point conditions for circuit packs, little or no attention has yet been paid to the reduction of circuit pack life due to such corrosive materials. Of course breakdown of a circuit pack is accompanied by the attendant breakdown in the desired activity which is being controlled or governed by the circuit pack.

SUMMARY OF THE INVENTION

The present invention seeks to provide an assembly of circuit pack and environmental protection which will minimize the hazards produced by the presence of corrosive materials in the atmosphere.

Accordingly, the present invention provides an assembly of a circuit pack and an environmental protection for the pack wherein:- a pack is provided for insertion into an electronic shelf, the pack having a front end region, a rear end region and side regions extending between the front and rear end regions, an electrical connector mounted along the rear end region, the connector extending outwardly beyond each side edge region and having electrical conductors fluid tightly sealed in a body of the connector, the conductors having terminals-facing rearwardly from the circuit pack; and the environmental protection comprising a heat conductive and fluid-tight cover surrounding the circuit pack from the front end region to the rear end region and being fluid-tightly sealed around the electrical connector with the rearwardly facing terminals extending beyond the confines of the cover and with the cover being in heat conductive contact with the circuit pack, and means being provided to enable the assembly to be guided into the shelf, a buckling strength sufficient to withstand front end pressure to overcome insertion resistance of the assembly into the shelf, and accessible handling means at a front end region of the cover to enable removal of the assembly from the shelf.

Thus, with an assembly according to the invention, there is complete environmental protection, complete protection provided for the electronic components and electrical conductors forming part of the pack. This protection is assisted by the sealed electrical conductors in the conductor body and also by the sealing of the fluid-tight cover to the connector.

The circuit pack is, of course, for use for movement into and out of an operational position within an electronic shelf and for this reason the buckling strength of the cover must be sufficient to withstand the loads imposed upon it by insertion and withdrawal from the shelf. The rigid cover may be of any suitable material for its purpose which includes an all metal cover or a plastic cover having a metal layer, possibly a surface layer, for EMI shielding. EMI shielding is an important consideration with the construction and may be provided in different ways either by an all metal cover or a metal layer upon a plastic cover as stated or alternatively the metal layer within a plastic body. The metal layer may be an imperforate layer or may be in the form of a metal cage which is embedded in the plastic body or disposed upon one surface of the body.

In its capacity as an environmental protection, the rigid fluid-tight cover must transfer heat away from the electronic assembly. Hence, the need for the requirement of the invention that the cover lies in heat conductive engagement with the circuit pack. To act as a heat sink, the cover is provided preferably with an enlarged external surface for heat removal. This may be provided by the cover having a plurality of corrugations to increase the external surface area.

One embodiment of the invention will now be described, by way of example, with reference to the accompanying drawings, in which:

BRIEF DESCRIPTION OF THE DRAWINGS

FIG. 1 perspective view from the rear of the circuit pac and environmental protection assembly of the embodiment;

FIG. 2 is a view similar to FIG. 1 of a cover of the assembly;

DESCRIPTION OF THE PREFERRED EMBODIMENT

Figure 3:
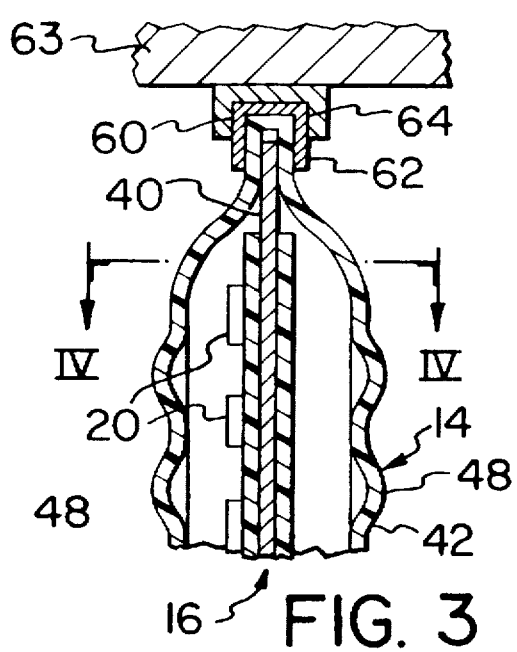
FIG. 3 is cross-sectional of part of the assembly and taken along line III—III in FIG. 1.
Figure 4:
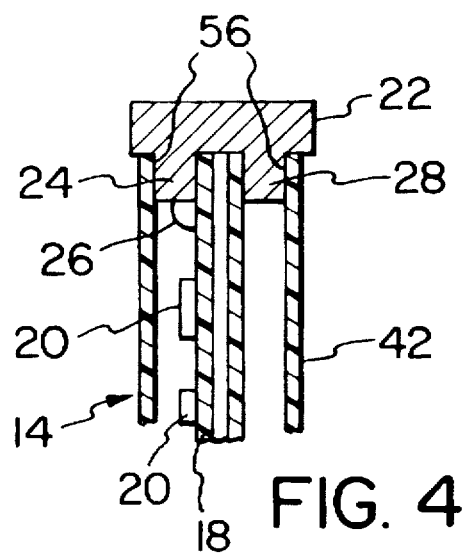
FIG. 4 is a cross-sectional view taken along line IV—IV in FIG. 3.

As shown in FIGS. 1 to 4 of the drawings, in the embodiment, there is provided an assembly 10 of a circuit pack 12 and an environmental protection 14. The circuit pack 12 may comprise more than one printed circuit board, but in the embodiment only a single board 16 is used. This circuit board 16 is conventional for circuit packs in that it has a printed circuit board substrate 18 carrying electrical circuitry in the form of electrical conductors (not shown) and electronic components 20 extending from one surface of the substrate 18 and forming part of the circuitry of the board. The circuit pack 12 differs from conventional packs however in that a rear end electrical connector 22 for mounting the circuit pack into a mating connector of a back plane of a printed circuit board is of different configuration and design from normal rear end connectors. The connector 22 is mounted along the rear end region of the board 16 with one side 24 of the connector extending alongside the rear end region of the board as is conventional so that conductors (not shown) within the connector are electrically connected by terminal ends 26 with terminals upon the board in conventional fashion. The connector 22 does however extend across the rear end surface of the board, as shown particularly in FIG. 4, and has another flange 28 extending around the other side of the board. The flanges 24 and 28 are to provide outwardly facing surfaces for securing the environmental protection 14 thereto as will be described. The connector 22 is a sealed connector in that its electrical conductors are sealed within an insulating body of the connector possibly by a fluid-tight packing of grease, so that moisture in any form cannot pass along the rear facing terminals 32 (FIG. 1) and through the body of the connector.

As shown by FIG. 3, the printed circuit board 16 also comprises a heat conductive layer 38 (preferably of copper) which is embedded within and which extends throughout the total surface area of the printed circuit board and has marginal edge regions 40 extending from remote edges of the substrate. FIG. 3 shows the top part of the printed circuit board only in the assembly to illustrate the one side region of the printed circuit board. The other and lower side region is similar in construction. The environmental protection 14 is provided by a sleeve 42 (see particularly FIG. 2). The sleeve 42 is formed closed at one end 44 and open at the other end 46. The sleeve 42 has two major sides 48 which are spaced apart a distance sufficient to define a chamber for containing the printed circuit board 16 and the mounted components 20. The sleeve has remote edge regions 50 which extend from front to rear along the top and bottom of the sleeve. At the edge regions the sides 48 approach closer together so that the edge regions are narrower than the remainder of the sleeve. The distance apart of the sides 48 at the edge regions is such that when fitted over the printed circuit board 16 the inside surfaces of the side walls 48 lie in contact with the remote surfaces of the marginal edge regions 40 of the heat conductive layer 38. The sleeve is resiliently flexible and by the application of pressure to reduce the distance between the remote edge regions, the sleeve may be easily slid over the printed circuit board during assembly. This pressure is applied in an upward and downward direction as indicated by arrows 52 in FIG. 2. This has the effect of moving the edge regions 50 towards each other and thereby moving the sides 48 further apart at the edge regions so that the inside surfaces of the sides 48 lie clear of the remote surfaces of the edge regions 40 during the assembly process. Between the edge regions 50, each of the sides 48 is formed with a plurality of parallel corrugations 54 which extend in a direction from front to rear of the sleeve so as to increase the outer surface area of the sleeve for heat exchange purposes.

Figure 5:
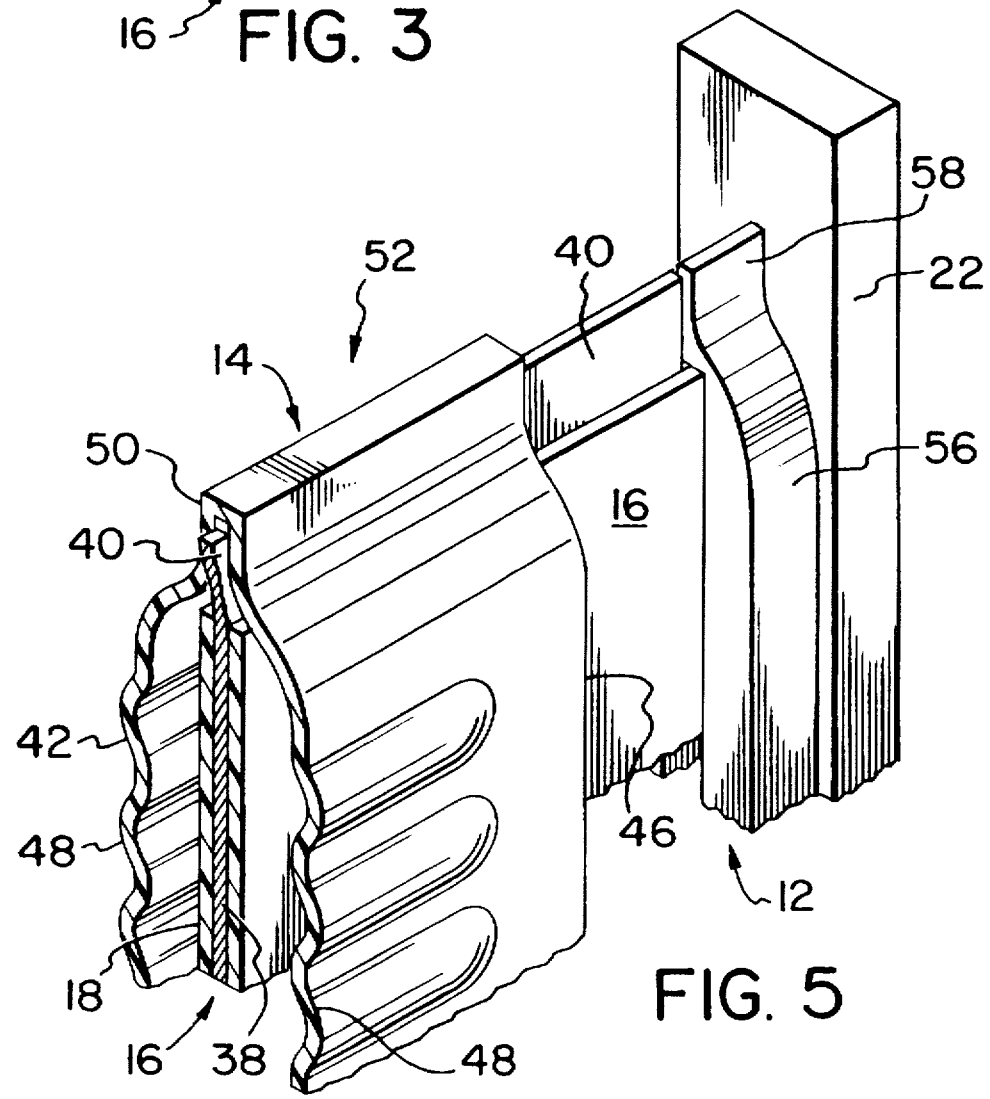
FIG. 5 is isometric view of part of the assembly shown partly exploded.

It is imperative that in the total assembly, the sleeve 42 is fluid-tightly secured in position to the connector 22. Hence a surface on the connector for sealing against the sleeve must be substantially complementary in shape to the inside surface of the sleeve which includes the inside surface within the remote edge regions 50. For this purpose, flanges 24 and 28 have oppositely facing outer surfaces 56 which are substantially planar and converge at upper and lower ends to merge with narrow end flanges 58 which are designed to fit comfortably within the remote edge regions. 50. This is as shown in FIG. 5. Also to assist in the assembly function, the corrugations 54 terminate short of the open end 46 of the sleeve as shown by FIG. 2 to provide planar end regions to the sides 48 for fitting against the surfaces 56 of the flanges 24 and 28.

Figure 6:
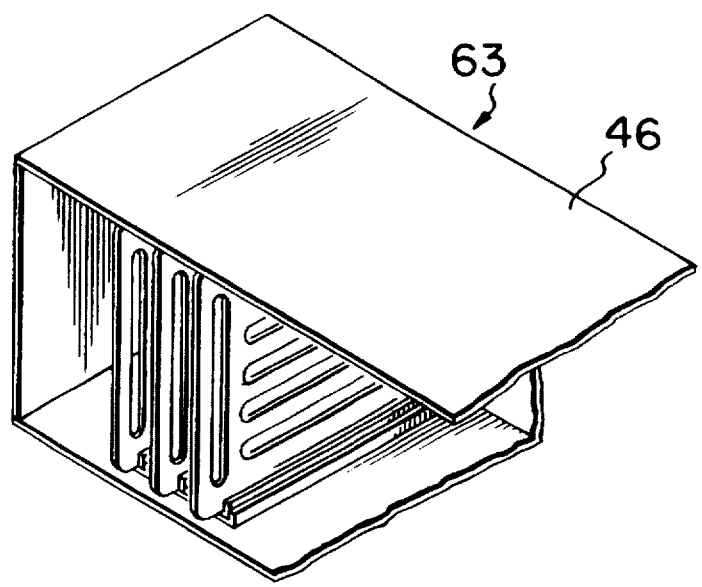
FIG. 6 is an isometric view of a shelf having a plurality of assemblies of the embodiment mounted therein.

In addition, the assembly also comprises a resilient clip means at each of the remote edge regions 50 of the sleeve for causing the remote edge regions to heat conductively grip the remote surfaces of the marginal end regions 40 of the heat conductive layer 38. As shown particularly in FIG. 3, each of the clip means comprises a U-shaped clip 60 which is resiliently flexible and must be sprung open to force-fit it laterally around the outside surface of an associated edge region 50 of the sleeve. The resiliency of each clip then maintains the clip in position while applying inward pressure upon the edge region 50 to grip upon opposite sides of the marginal edge region 40 for heat conductive contact and heat removal purposes. Each clip 60 has an outer peripheral surface 62 which provides an outer guide surface profile for sliding reception of the assembly into an operational position within an electronic shelf 63 as shown by FIGS. 3 and 6. This outer surface 62, in each case, has two substantially planar sides and a planar base connecting the sides as is clearly illustrated. Each clip 60 is capable of sliding reception within a normal guide slot 64 in the shelf 63 as clearly illustrated by FIG. 3.

The sleeve 42 is mounted over the printed circuit board by causing the sleeve to flex by application of pressure in the direction of arrows 52 in FIG. 2 and sliding the cover over the printed circuit board as discussed above. During this movement the widened edge regions 50 move comfortably with clearance along the marginal edge regions 40 of the heat conductive layer 38. Upon the open end 46 of the sleeve reaching the rear end of the printed circuit board, the sleeve then slides over the flanges 24 and 28 and over the flanges 58 which are aligned with respective marginal edge regions 40 of the layer 38. The sleeve is then in the position shown by FIG. 4. In this position, the sleeve is secured to the surfaces 56 and to the flanges 58 by a suitable material which fluid-tightly secures the sleeve in position. This securing material may depend upon the material from which the sleeve is formed. The sleeve may be formed from metal as discussed above and which is also preferable because of its heat dissipating characteristics. In this case, the sleeve may be secured to the surfaces 56 and to the flanges 58 by solder. Alternatively, the sleeve may be formed basically from a plastic material, as by some molding operation and in this case a suitable adhesive will suffice to secure the sleeve to the respective surfaces. If the-sleeve is formed basically from a plastics material then it may be preferred to provide an EMI shield in the cover. This shield may be in the form of a thin layer of conductive metal (not shown) upon either the inside or the outside surface of the sleeve or the sleeve may be laminated from plastics material with an inside layer of electrically conductive metal. Any of these shield layers may be a solid imperforate layer or alternatively may comprise an open mesh-type structure.

As may be seen from the above embodiment, the invention provides an assembly of circuit pack and environmental protection for the pack in which corrosive atmospheres are not allowed to come into contact with corrosion suspect surfaces of the pack e.g. electronic components. Hence, the above assembly is expected to be operational for longer periods than an assembly having a similar pack and which is used in acidic atmospheric conditions. To ensure that the greatest care is taken for protection of the circuit pack, it is preferred that the sealed enclosure within the sleeve and containing the circuit pack should be filled either with dry air or an inert gas.

As may be seen, as the environmental protection completely surrounds the circuit pack then it is essential for heat generated by the electronic components to be removed. According to the invention this is effected by the heat conductive contact between the heat conductive sleeve and the circuit pack. In more detail, and with regard to the embodiment, heat removal is easily effected by transfer of heat from the electronic components, into the heat conductive layer 38 and from the marginal edge regions 40 of this layer directly into the edge regions 50 of the sleeve for dispersion from the outside surface of the sleeve itself. This heat dispersion is assisted by the increased surface area provided by the corrugations 54. These corrugations add front to rear buckling strength to the sleeve which is necessary to assist in assembly of the sleeve over the circuit pack. In fact the sleeve 42 must be made of sufficient strength to withstand any buckling forces which are applied to it not only for initial application over the circuit pack but also for subsequent removal and further assembly onto the circuit pack. For this reason, and also for the purpose of inserting the assembly into the operational station in the shelf, the assembly must have an accessible handling means. Conveniently, in the embodiment, the handling means is in the form of a handle 70 formed in the cover at its front end during its manufacture (FIG. 2).

What is claimed is:

1. An assembly of a printed circuit board and an environmental protection for the pack wherein:

the printed circuit board is provided for insertion into an electronic shelf, the printed circuit board having a front end region, a rear end region, the printed circuit board also having at least one circuit layer, a substrate of electrically insulating material supporting the circuit layer and a heat conductive layer also supported by the substrate and having remote marginal edge regions extending outwards beyond the substrate along the side edge regions to expose the marginal edge regions, the printed circuit board also carrying and side edge regions extending between the front and rear end region, an electrical connector mounted along the rear end region, the connector extending outwardly beyond each side edge region and having electrical conductors fluid-tightly sealed in a body of the connector, the conductors having terminals facing rearwardly from printed circuit board, and the environmental protection comprising a heat conductive and fluid-tight cover surrounding the printed circuit board from the front end region to the rear end region and being fluid-tightly sealed around the electrical connector with the rearwardly facing terminals extending beyond the confines of the and the cover having remote edge regions which closely contact the marginal edge regions of the heat conductive layer to be in heat conductive contact with the heat conductive layer, the assembly also comprising a resilient clip at each remote edge region, each clip being held in resiliently flexed condition around each remote edge region to cause the remote edge region to grip with thermally conductive contact around the associated marginal edge region of the heat conductive layer, and a guide being provided to enable the assembly to be guided into the shelf, a buckling strength sufficient to withstand front end pressure to overcome insertion resistance of the assembly into the shelf, and accessible handling means at a front end region of the cover to enable removal of the assembly from the shelf.

2. An assembly according to claim 1 wherein the cover comprises an electromagnetic shield.

3. An assembly according to claim 1 wherein the cover comprises an electrically conductive metal.

4. An assembly according to claim 1 wherein the cover is detachable from the circuit pack and from the connector with the resilient clip being removable, the cover being resiliently flexible by applying pressure to reduce the distance between the remote edge regions whereby each remote edge region is caused to widen to move it out of close contact with its marginal edge region of the heat conductive layer so as to allow for removal and reattachment of the cover to the circuit pack.

5. An assembly according to claim 4 wherein the cover has a plurality of corrugations which extend in a direction from a front towards a rear end region of the cover to increase the outer surface area of the cover for heat exchange purposes.

6. An assembly according to claim 1 wherein each clip comprises an outer guide surface profile for sliding reception of the assembly into an operational position for the assembly in the electronic shelf.

* * * * *